United States Patent [19]

Sinnadurai et al.

[11] 4,448,306

[45] May 15, 1984

[54] INTEGRATED CIRCUIT CHIP CARRIER

[75] Inventors: F. Nihal Sinnadurai, Woodbridge; Anthony J. Cook, Dippenhall, Near Farnham; Keith W. Gurnett, Bracknell, all of England

[73] Assignee: British Telecommunications, London, England

[21] Appl. No.: 342,358

[22] Filed: Jan. 25, 1982

[30] Foreign Application Priority Data

Feb. 9, 1981 [GB] United Kingdom ............... 8103840

[51] Int. Cl.³ ...................... B65D 73/02; B65D 85/42
[52] U.S. Cl. .................................. 206/331; 206/332; 206/334
[58] Field of Search ............... 206/331, 328, 329, 330, 206/332, 334

[56] References Cited

U.S. PATENT DOCUMENTS

| | | | |
|---|---|---|---|
| 3,441,853 | 4/1969 | Bodine | 206/331 |
| 3,454,154 | 7/1969 | Peters et al. | 206/331 |
| 3,673,543 | 6/1972 | Garner | 206/328 |
| 4,026,412 | 5/1977 | Henson | 206/331 |
| 4,084,210 | 4/1978 | Forrest | 206/331 |

Primary Examiner—Joseph Man-Fu Moy
Attorney, Agent, or Firm—Cushman, Darby & Cushman

[57] ABSTRACT

An integrated circuit chip carrier is made of plastics material, such as glass/epoxy printed circuit board material, and comprises a base and a side wall attached to the top surface of the base to define a chip mounting cavity. Conductor tracks on the base extend from connecting pads inside the cavity to connecting points on the periphery of the carrier. The chip carrier can be fabricated as one of an array of such carriers for subsequent separation.

8 Claims, 2 Drawing Figures

INTEGRATED CIRCUIT CHIP CARRIER

BACKGROUND OF THE INVENTION

The invention relates to the field of integrated circuit chip carriers. Chip carriers provide an alternative method of packaging integrated circuit chips to the well-known dual in-line package (DIP).

Known forms of chip carrier consist of a usually rectangular base of ceramic material. A central area on the base is provided, on to which an integrated circuit chip or die is mounted and secured, for example using an epoxy resin adhesive. Leads are then connected between the appropriate points on the die to metal bonding pads provided on the carrier base. A preformed metallization pattern on the carrier base connects the bonding pads to terminal contacts formed around the periphery of the base. A metal or ceramic lid is then secured over the base so as to enclose and protect the die. The ceramic chip carrier is thereafter mounted on a printed circuit board together with a series of other chip carriers and electronic components that go to form the complete circuit.

The use of ceramic material for the chip carrier is expensive and problems can also arise when the ceramic base is later bonded to a conventional epoxy/glass printed circuit board, due to the differential expansion between the two materials. In extreme environmental conditions the ceramic chip carrier can break away from the printed circuit board.

BRIEF SUMMARY OF THE INVENTION

The invention provides a chip carrier having a plastics base and a plastics side wall connected to the top surface of the base. The side wall extends around the periphery of the chip carrier to define a chip mounting cavity. Conductive tracks formed on the base extend from connecting pads in the cavity to connecting points on the periphery of the chip carrier.

The caavity may be filled with a layer of protective coating material and, furthermore, the chip carrier may be provided with a lid, thus providing the integrated circuit chip with mechanical protection and protection in conditions of high humidity.

Because the chip carrier is made of the same (or a similar) material as a conventional epoxy/glass printed circuit board, the problem of differential expansion is not encountered.

DESCRIPTION OF PREFERRED EMBODIMENT

Figure 1:
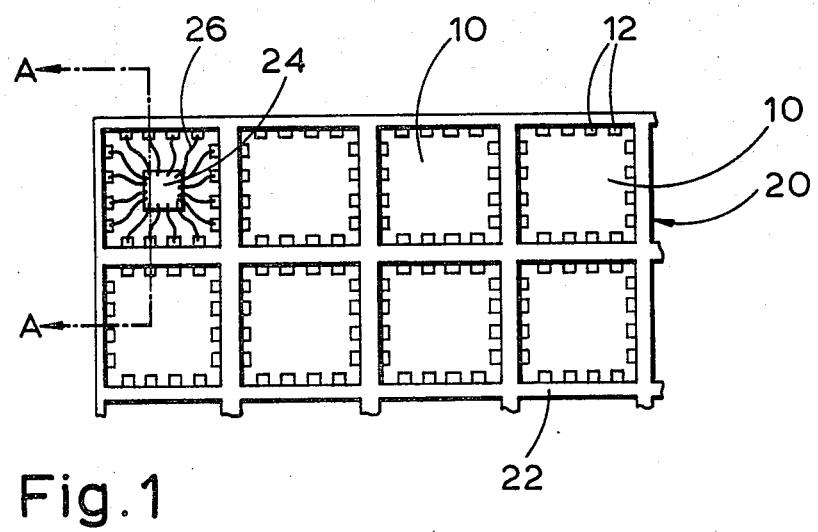
FIG. 1 is a plan view of part of an array of chip carriers before separation, shown at approximately three times actual size.

A series of chip carriers according to the invention are formed from a base sheet 10 of a plastics material, for example glass reinforced epoxy resin such as is conventionally used in printed circuit board manufacture.

The base sheet 10 is formed with a series of rectangular arrays of metal pads 12, each of the arrays defining an individual chip carrier. A series of holes are formed in the sheet 10, one of which is shown at 14 in FIG. 2. A plated-through metallization 16 formed in each of the holes 14 connects each of the pads 12 to a corresponding pad 18 on the underside of the sheet 10. The pads 12 and 18 and the plated-through metallization 16 are all formed by conventional techniques used in printed circuit board manufacture, and are preferably formed of copper plated with gold or a nickel-gold alloy.

A grid 20 formed of the same material as the base 10, is bonded to the base 10, the arms 22 of the grid extending over the lines of holes 14 and over the portion on the metallization 16 formed on the upper surface of the base 10.

A series of integrated circuit dice 24 are then bonded on to base 10 in the centre of each of the arrays formed by the pads 12. Only a single die 24 is shown in FIG. 1 but it is to be understood that a die will be mounted in each of the eight illustrated arrays. The die 24 is preferably bonded to the base 10 by means of an epoxy adhesive compatible with the material of the base 10. Leads 26 are then connected between the appropriate points on the die 24 and each of the pads 12, in a process known as "wire bonding". The number and disposition of the pads 12 can be determined in advance so as to correspond to the external connections on the die 24.

Figure 2:
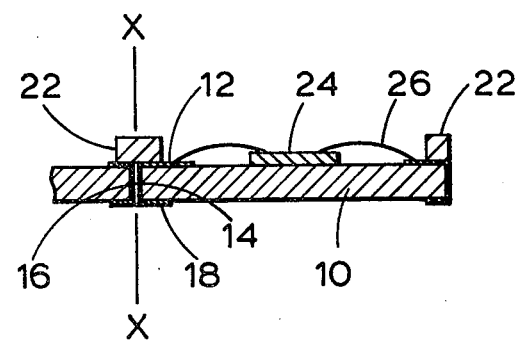
FIG. 2 is an enlarged cross-sectional view taken along the line A—A of FIG. 1.

It can be seen from FIG. 2 that each of the dice 24 is positioned in a cavity or depression formed by the arms 22 of the grid 20. This cavity can be filled with a layer of coating material made of a plastics material, which serves to enclose and protect the die 24. Thereafter a cover sheet (not shown) preferably formed of the same material as the base 10, may be secured over the grid 20 to form a protective cover (known as a "lid") for each of the chip carriers. Alternatively, a further layer of the coating material could be applied instead of a lid.

Once the dice 24 have been mounted and the appropriate protective covering has been applied, the whole array is then separated to form the individual chip carriers. This is done by cutting with a diamond saw along the centre lines of the arms 22 of the grid 20, on the axis X—X shown in FIG. 2. The resulting individual, leadless chip carriers can be mounted on printed circuit boards, together with other circuit components, using the pads 18 to interconnect to a preformed metallization pattern on the circuit board in known manner.

It can be seen that as the chip carrier can be made of conventional printed circuit board material eg, glass/epoxy, it would be possible in some cases for the chip carrier to be formed integrally with a printed circuit board. In such a case, the grid 20 would be in the form of a single rectangle mounted on the upper surface of the printed circuit board. Alternatively, where the board is of multilayer laminated construction, the top layer of the board may be formed with a cut-out portion and the metallization pads 12 are formed on the next layer down such that when the top layer is laminated onto the rest of the board, the chip carrier is defined by a cavity in the upper surface of the board. The metallization pads 12 would be integral with the metallization pattern on the rest of the printed circuit board and the plated-through metallization 16 and pads 18 would be dispensed with.

It can be appreciated that the mounting of the circuit dice 24 and the subsequent processing up to the point at which the individual chip carriers are separated is carried out with an array which is much easier to handle than are the individual chip carriers, and which can readily be processed by automatic assembly apparatus. In addition the formation of the base 10 and the grid 20 from conventional glass/epoxy printed circuit board material allows well tried and tested techniques to be used and also greatly reduces the cost of the final item.

The chip carriers in which the circuit dice are protected as described have exhibited high reliability in conditions of high humidity. Complete packages have been successfully tested at 90% relative humidity and 110° C. for 2,000 hours.

What we claim is:

1. A structure for mechanically mounting integrated circuit dice within respective protective cavities and for also providing electrical connections from each die within its cavity to external electrical connection points outside its cavity, said structure comprising:

a base sheet of plastics material having a top surface and a bottom surface;

a plurality of metallized holes being formed in said base sheet between said top and bottom surfaces and disposed about respectively different predetermined contiguous areas on said top surface of said base sheet;

a plurality of first metallized pads disposed on said top surface in register with said plurality of holes, with respectively corresponding ones of the metallized holes and first pads being electrically connected;

a plurality of second metallized pads disposed on said bottom surface also in register with said plurality of holes, with respectively corresponding ones of the metallized holes and second pads being electrically connected;

at least some of said first pads being individually extended in two directions away from their corresponding holes so as to have opposite ends terminating within different but contiguous ones of said predetermined areas; and a grid sheet of plastics material bonded to said top surface of the base sheet, said grid sheet having plural open apertures formed by interconnected arms which are in alignment with said holes and covering portions of said first pads, said apertures being in register with said predetermined areas such that said arms define the sidewalls of said protective cavities;

said structure thereby providing plural integrated circuit carriers when cut apart along lines defined by said holes, each carrier having its own protective cavity defined by a corresponding one of said apertures and also having an array of generally U-shaped conductive leads formed by respective portions of said metallized holes and pads connecting the top surface of the carrier from points within the protective cavity to the bottom surface of the carrier outside that cavity.

2. A structure as in claim 1 further comprising:

an integrated circuit die bonded to said base sheet at each of said predetermined areas; and electrically conductive wire connections extending from predetermined points on said integrated circuit die to the respectively corresponding terminal ends of said first pads.

3. A structure as in claim 2 further comprising a filling of protective plastics material within each of said cavities covering its respective integrated circuit die and the associated wire connections.

4. A structure as in claim 3 further comprising a protective cover sheet of plastics material bonded on top of the sidewalls of each cavity.

5. A method for making integrated circuit carriers, said method comprising the steps of:

forming a plurality of metallized holes in a base sheet of plastics material, said holes extending from a top surface of the base sheet to a bottom surface and being disposed about respectively different predetermined contiguous areas in said top surface;

forming a plurality of first metallized pads on said top surface in register with said plurality of holes, with respectively corresponding ones of the metallized holes and first pads being electrically connected and at least some of said first pads being individually extended in two directions away from their corresponding holes so as to provide opposite ends terminating within different but contiguous ones of said predetermined areas;

forming a plurality of second metallized pads on said bottom surface also in register with said plurality of holes and electrically connected thereto;

bonding a grid sheet of plastics material to said top surface, said grid sheet having plural open apertures formed by interconnected arms which are in alignment with said holes and covering portions of said first pads, said apertures being in register with said predetermined areas such that said arms define the sidewalls of plural protective cavities; and cutting said base sheet and grid sheet along said arms and through said holes to provide plural integrated circuit carrier structures, each carrier having its own protective cavity defined by a corresponding one of said apertures and also having an array of generally U-shaped conductive leads formed by respective portions of said metallized holes and pads to connect the top surface of the carrier from points within the protective cavity to the bottom surface of the carrier outside that cavity.

6. A method as in claim 5 further comprising the steps of:

bonding an integrated circuit die to said base sheet at each of said predetermined areas; and connecting conductive wires from predetermined points on said die to respectively corresponding terminal ends of said first pads.

7. A method as in claim 6 further comprising the step of:

filling each of said cavities with protective plastics material so as to cover its respective integrated circuit die and the associated wire connections.

8. A method as in claim 7 further comprising the step of:

bonding a protective cover sheet of plastics material to the top of the sidewalls of each cavity.

* * * * *